(12) United States Patent
Yon

(10) Patent No.: US 7,710,178 B2
(45) Date of Patent: May 4, 2010

(54) DELAY APPARATUS FOR DELAY LOCKED LOOP

(75) Inventor: Sun-Hyuck Yon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 20 days.

(21) Appl. No.: 11/819,632

(22) Filed: Jun. 28, 2007

(65) Prior Publication Data

US 2008/0136477 A1    Jun. 12, 2008

(30) Foreign Application Priority Data

Dec. 8, 2006    (KR)    ...................... 10-2006-0124460

(51) Int. Cl.
  *H03K 3/00*    (2006.01)
  *H03H 11/16*    (2006.01)
  *H03K 5/13*    (2006.01)
(52) U.S. Cl. ........................................ 327/250; 327/158
(58) Field of Classification Search ................. 327/261, 327/262
  See application file for complete search history.

(56) References Cited

U.S. PATENT DOCUMENTS 6,087,874 A * 7/2000 Hogeboom ................. 327/270

| | | | |
|---|---|---|---|
| 6,525,988 B2 | 2/2003 | Ryu et al. | |
| 6,836,437 B2 | 12/2004 | Li et al. | |
| 2004/0212406 A1 | 10/2004 | Jung | |
| 2005/0168260 A1 * | 8/2005 | Tomerlin et al. | ............ 327/278 |
| 2006/0020835 A1 | 1/2006 | Samson et al. | |

FOREIGN PATENT DOCUMENTS

| JP | 04-060993 | 2/1992 |
|---|---|---|
| JP | 2005251370 | 9/2005 |
| KR | 1019950004855 | 5/1995 |
| KR | 100179913 | 11/1998 |
| KR | 1019990081404 | 11/1999 |

* cited by examiner

*Primary Examiner*—Lincoln Donovan
*Assistant Examiner*—Daniel Rojas
(74) *Attorney, Agent, or Firm*—Venable LLP; Jeffri A. Kaminski

(57) ABSTRACT

A delay apparatus for a delay locked loop includes a plurality of delay devices that are formed by modeling a plurality of signal processing structures through which a delay locked loop clock output from a delay locked loop reaches an output circuit of a semiconductor memory apparatus from an output terminal of the delay locked loop. At least one of the plurality of delay devices is composed of a variable delay device in which a delay time varies according to a change in operation voltage.

18 Claims, 3 Drawing Sheets

DELAY APPARATUS FOR DELAY LOCKED LOOP

CROSS-REFERENCE TO RELATED PATENT APPLICATION

This application claims the benefit of Korean Patent Application No. 10-2006-0124460, filed on Dec. 8, 2006, in the Korean Intellectual Property Office, the disclosure of which is incorporated herein in its entirety by reference.

BACKGROUND OF THE INVENTION

1. Technical Field

The present invention relates to a delay locked loop. More particularly, the present invention relates to a delay apparatus for a delay locked loop that compensates for time required when a clock output by a delay locked loop reaches a data output terminal of a semiconductor memory apparatus.

2. Related Art

In general, a delay locked loop (DLL) synchronizes a phase of an external clock CLK supplied from the outside of a semiconductor memory apparatus and a phase of an internal clock iclk used inside the semiconductor memory apparatus.

The phase of the external clock CLK and the phase of the internal clock iclk are synchronized with each other by the following method. The delay locked loop buffers the external clock CLK and generates the internal clock iclk. The delay locked loop allows the internal clock iclk to pass through a delay apparatus that constitutes a predetermined signal processing time. The delay locked loop allows the internal clock iclk having passed through the delay apparatus to be fed back so as to synchronize the internal clock iclk with the external clock CLK. At this time, the delay locked loop repeatedly performs the above-described process. When the internal clock iclk is synchronized with the external clock CLK, the delay locked loop outputs delay locked loop clocks fclk and rclk.

The delay locked loop clock fclk is synchronized with a falling edge of the external clock CLK, and the delay locked loop clock rclk is synchronized with a rising edge of the external clock CLK.

A general delay apparatus includes an inverter chain or resistors and capacitors that are alternately or repeatedly disposed. A delay apparatus according to the related art for the delay locked loop includes modeling delay devices that are formed by modeling signal processing structures through which a delay locked loop clock reaches an output terminal of a semiconductor memory apparatus from an output terminal of the delay locked loop. The modeling delay devices may be provided at the ends of the delay locked loop.

That is, the delay apparatus for the delay locked loop according to the related art constitutes various signal processing structures through which the delay locked loop clock reaches the output terminal of the semiconductor memory apparatus from the output terminal of the delay locked loop.

For example, in the case of the modeling delay device that models a buffer, the modeling delay device is constructed similarly to the buffer. The modeling delay device has an unchangeable delay time.

The number of modeling delay devices may be changed according to the number of signal processing structures through which the delay locked loop clock reaches the output terminal of the semiconductor memory apparatus from the output terminal of the delay locked loop.

As such, the reason the number of modeling delay devices is determined according to the number of signal processing structures is to delay the delay locked loop clock by an actual signal processing delay time.

During the operation of the semiconductor memory apparatus that uses the delay locked loop, the supplied operation voltage may be changed.

As described above, the delay apparatus for the delay locked loop according to the related art delays and outputs the input signal by the locked delay time regardless of the change in the operation voltage.

However, in accordance with the change in the operation voltage, the delay apparatus for the delay locked loop according to the related art needs to output the phase locked loop clock in a state where the phase of the phase locked loop clock is shifted to the right side or the left side as compared with a normal phase. In this case, the phase difference departs from a predetermined range due to the phase shift, which causes an erroneous operation in the semiconductor memory apparatus.

SUMMARY OF THE INVENTION

One embodiment may provide a delay apparatus for a delay locked loop that may be capable of preventing an error from occurring in a phase of a delay locked loop clock due to a change in an operation voltage.

Another embodiment of the present invention may provide a delay apparatus for a delay locked loop. The delay apparatus may include a plurality of delay devices that may be formed by modeling a plurality of signal processing structures through which a delay locked loop clock output from a delay locked loop may reach an output circuit of a semiconductor memory apparatus from an output terminal of the delay locked loop. At least one of the plurality of delay devices may be composed of a variable delay device in which a delay time may vary according to a change in operation voltage.

Another embodiment of the present invention may provide a delay apparatus for a delay locked loop that may model at least one signal processing structure through which a delay locked loop clock output from a delay locked loop may reach an output circuit of a semiconductor memory apparatus from an output terminal of the delay locked loop. The delay apparatus may include a voltage detecting unit that may detect a change in operation voltage, a delay time control unit that may output a delay time control signal in response to the output of the voltage detecting unit, a plurality of delay units that may selectively operate in accordance with the delay time control signal, may delay the delay locked loop clock for a delay time corresponding to the delay time control signal, and may output the delay locked loop clock, and a signal output unit that may combine the output of a delay unit selected from among the plurality of delay units and output the combined result as the delay locked loop clock.

DESCRIPTION OF EXEMPLARY EMBODIMENTS

Exemplary embodiments will now be described in detail with reference to the accompanying drawings.

A delay apparatus for a delay locked loop according to one embodiment may include a plurality of delay devices that may sequentially delay and output input signals. The plurality of delay devices may be formed by modeling various signal processing structures through which a delay locked loop clock may reach an output terminal of a semiconductor memory apparatus from an output terminal of the delay locked loop, and any one of the plurality of delay devices may be composed of a variable delay device in which an amount of delay time may vary according to a change in an operation voltage.

Figure 1:
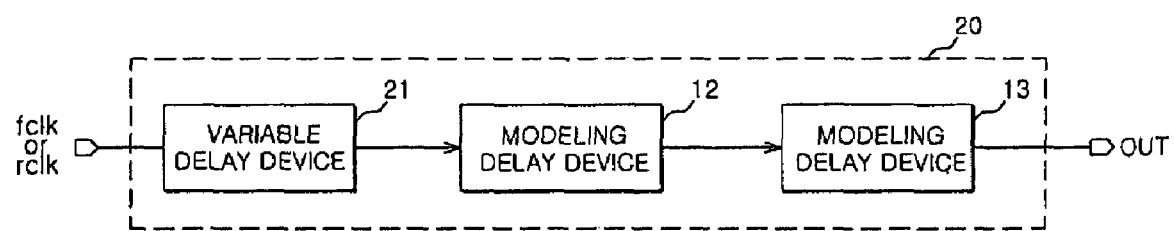
FIG. 1 is an exemplary block diagram illustrating a delay apparatus for a delay locked loop according to one embodiment.

As shown in FIG. 1, the delay apparatus for a delay locked loop may have a structure where any one of the plurality of modeling delay devices may be replaced by a variable delay device 21 in which an amount of delay time may vary according to a change in operation voltage.

Figure 2:
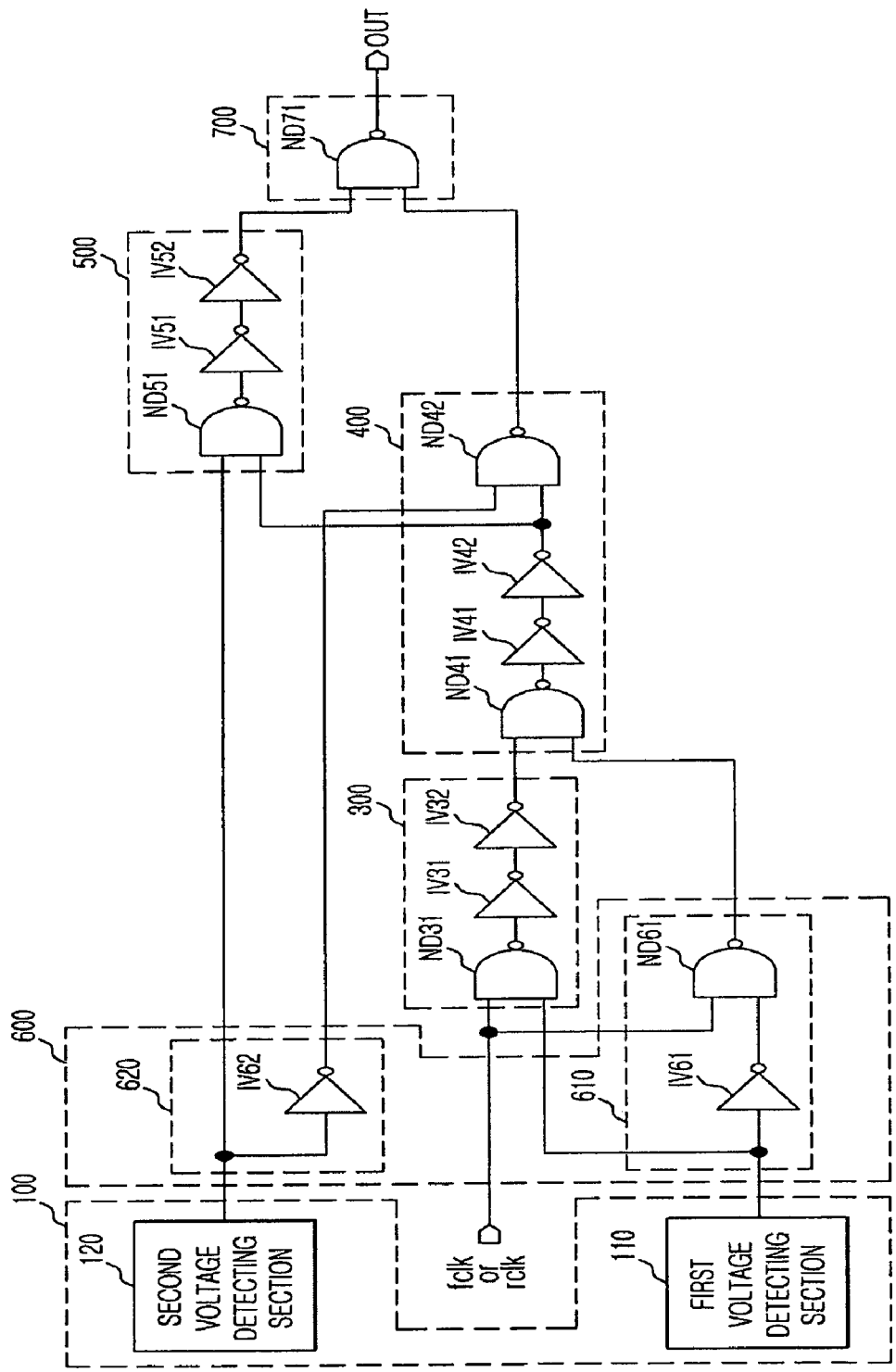
FIG. 2 is an exemplary circuit diagram illustrating a variable delay unit shown in FIG. 1.

As shown in FIG. 2, the variable delay device 21 may include a voltage detecting unit 100 that may detect a change in an operation voltage, a delay time control unit 600 that may output a delay time control signal in response to the output of the voltage detecting unit 100, first to third delay units 300 to 500 that may selectively operate according to the delay time control signal and delay and output input signals by a delay time which may correspond to the delay time control signal, and a signal output unit 700 that may combine and outputs the output of a delay unit that may be selected from among the first to third delay units 300 to 500.

The voltage detecting unit 100 may include a first voltage detecting section 110 that may detect when a voltage level of an operation voltage reaches a low voltage level that is lower than a voltage level of a normal voltage, and a second voltage detecting section 120 that may detect when the operation voltage reaches a high voltage level that is higher than the voltage level of the normal voltage.

The first voltage detecting section 110 may be composed of a comparator that may distribute the operation voltage, compare the distributed voltage and a reference voltage whose voltage level may be set to correspond to the low voltage level, and output the compared result. The second voltage detecting section 120 may be composed of a comparator that may distribute the operation voltage, compare the distributed voltage and a reference voltage whose voltage level may be set to correspond to the high voltage level, and output the compared result.

When the first voltage detecting section 110 detects the low voltage, the first voltage detecting section 110 may output a signal at a predetermined level (for example, a low level), and when the second voltage detecting section 120 detects the high voltage, the second voltage detecting section 120 may output a signal at a predetermined level (for example, a high level).

The delay time control unit 600 may include a first control section 610 that may output the output of the first voltage detecting section 110 as a first delay time control signal which may decrease a delay time of the variable delay device 21, and a second control section 620 that may output the output of the second voltage detecting section 120 as a second delay time control signal which may increase a delay time of the variable delay device 21.

The first control section 610 may include a signal line through which the first delay time control signal according to the output of the first voltage detecting section 110 may be input to the first delay unit 300, an inverter IV61 that may receive the output of the first voltage detecting section 110, and a NAND gate ND61 that may input the input signal and the first delay time control signal according to the output of the inverter IV61 to the second delay unit 400.

The second control section 620 may include a signal line through which the second delay time control signal according to the output of the second voltage detecting section 120 may be input to the third delay unit 500, and an inverter IV62 that may input the second delay time control signal according to the inverted output of the second voltage detecting section 120 to the second delay unit 400.

The first delay unit 300 may include a NAND gate ND31 that may receive the input signal and the output of the first voltage detecting section 110, a first inverter IV31 that may receive the output of the NAND gate ND31, and a second inverter IV32 that may receive the output of the first inverter IV31.

The second delay unit 400 may include a NAND gate ND41 that may receive the output of the first delay unit 300 and the output of the first control section 610, a first inverter IV41 that may receive the output of the first NAND gate ND41, a second inverter IV42 that may receive the output of the first inverter IV41, and a second NAND gate ND42 that may receive the output of the second inverter IV42.

The third delay unit 500 may include a NAND gate ND51 that may receive the output of the second inverter IV42 of the second delay unit 400 and the output of the second voltage detecting section 120, a first inverter IV51 that may receive the output of the NAND gate ND51, and a second inverter IV52 that may receive the output of the first inverter IV51.

The above structures of the first to third delay units 300 to 500 are exemplary. The first to third delay units 300 to 500 may have any suitable structure.

The signal output unit 700 may include a NAND gate ND71 that may receive the output of the second delay unit 400 and the third delay unit 500, and perform a NAND operation thereon and output the operation result.

The operation of the delay apparatus for a delay locked loop according to one embodiment will now be described.

For example, it may be assumed that a normal voltage level may be 2.5 V, a low voltage level may be 2.2 V, a high voltage level may be 2.7 V, and an operation voltage may be an external voltage VDD.

First, when the external voltage VDD is at a normal voltage level, for example, when the external voltage VDD is at a voltage level in a range of 2.2 V or more but less than 2.7 V, the input signal may be delayed and output by a delay time corresponding to the first delay unit 300 and the second delay unit 400. The input signal may be an internal clock iclk.

Since the first voltage detecting section 110 may not detect the low voltage level, the first voltage detecting section 110 may output a high-level signal, and since the second voltage detecting section 120 may not detect the high voltage level, the second voltage detection section 120 may output a low-level signal.

In accordance with the high-level signal output by the first voltage detecting section 110, the first control section 610 may output the high-level signal to the first delay unit 300 and the second delay unit 400.

In accordance with the low-level signal output by the second voltage detecting section 120, the second control section 620 may output the low-level signal to the third delay unit 500, and output the high-level signal to the second delay unit 400.

In the first delay unit 300, since the high-level signal may be input to the NAND gate ND31, the first delay unit 300 may delay and output the input signal by a signal processing time with, for example, the NAND gate ND31, the first inverter IV31, and the second inverter IV32. The first delay unit 300 may perform a delay operation.

In the second delay unit 400, since the high-level signal is input to the first and second NAND gates ND41 and ND42, the second delay unit 400 may delay and output the output of the first delay unit 300 by a signal processing time with, for example, the first NAND gate ND41, the first inverter IV41, the second inverter IV42, and the second NAND gate ND42. The second delay unit 400 may perform a delay operation.

In the third delay unit 500, since the low-level signal is input to one input terminal of the NAND gate ND51, the third delay unit 500 may output the high-level signal to the signal output unit 700 regardless of an input signal level of the other input terminal of the NAND gate ND51. The third delay unit 500 may not perform a delay operation.

The signal output unit 700 may receive and invert the output of the second delay unit 400 and output the output of the second delay unit 400 at an original phase. An even number of the logic elements ND31, IV31, IV32, ND41, IV41, IV42, ND42, and ND71 may be supplied with the input signal. Among them, since the NAND gates may function as the inverters, a phase of the output signal of the signal output unit 700 may be the same as that of the input signal.

When the external voltage VDD is at a low voltage level, for example, the external voltage VDD has a voltage level of 2.2 V or less, the input signal may be delayed and output by a delay time corresponding to the second delay unit 400. As compared with the case where the external voltage VDD is at a normal voltage level, it may be possible to decrease the delay time, which may perform a correction operation on a phase of the signal that may be output by the signal output unit 700.

The first voltage detecting section 110 may detect the low voltage level and output a low-level signal. The second voltage detecting section 120 may not detect the high voltage level and may output a low-level signal.

The first control section 610 may output a low-level signal to the first delay unit 300 in accordance with the low-level signal that may be output by the first voltage detecting section 110, and may invert the input signal and output the inverted signal to the second delay unit 400.

The second control section 620 may output a low-level signal to the third delay unit 500 in accordance with the low-level signal that may be output by the second voltage detecting section 120, and may output a high-level signal to the second delay unit 400.

In the first delay unit 300, since a low-level signal may be input to one input terminal of the NAND gate ND31, the first delay unit 300 may output a high-level signal to the second delay unit 400 regardless of a voltage level of an input signal of the other input terminal of the NAND gate ND31. The first delay unit 300 may not perform a delay operation.

In the second delay unit 400, since a high-level signal may be input to the first and second NAND gates ND41 and ND42, the second delay unit 400 may delay and output the input signal, which may have been inverted by the first control unit 610, by a signal processing time from the inner structures, for example, the first NAND gate ND41, the first inverter IV41, the second inverter IV42, and the second NAND gate ND42. The second delay unit 400 may perform a delay operation.

In third delay unit 500, since a low-level signal may be input to one input terminal of the NAND gate ND51, the third delay unit 500 may output a high-level signal to the signal output unit 700 regardless of a voltage level of the input signal of the other input terminal of the NAND gate ND51. The third delay unit 500 may not perform a delay operation.

The signal output unit 700 may receive and invert the output of the second delay unit 400 and output the output of the second delay unit 400 at an original phase. An even number of the logic elements ND61, ND41, IV41, IV42, ND42, and ND71 may be supplied with the input signal. Among them, since the NAND gates may function as the inverters, a phase of the output signal of the signal output unit 700 may be the same as that of the input signal.

When the external voltage VDD is at the high-voltage level, for example, the external voltage VDD has a voltage level of 2.7 V or more, the input signal may be delayed and output by a delay time corresponding to the first delay unit 300, the second delay unit 400, and the third delay unit 500. As compared with the case where the external voltage VDD is at a normal voltage level, it may be possible to increase the delay time, which may perform a correction operation on a phase of the signal that may be output by the signal output unit 700.

The first voltage detecting section 110 may not detect the low voltage and may output a high-level signal, and the second voltage detecting section 120 may detect the high voltage and output a high-level signal.

The first control section 610 may output a high-level signal to the first delay unit 300 and the second delay unit 400 in accordance with the high-level signal that may be output by the first voltage detecting section 110.

The second control section 620 may output a high-level signal to the third delay unit 500 in accordance with the high-level signal that may be output by the second voltage detecting section 120, and output a low-level signal to the second delay unit 400.

In the first delay unit 300, since a high-level signal may be input to the NAND gate ND31, the first delay unit 300 may delay and output the input signal by a signal processing time from the inner structures, for example, the NAND gate ND31, the first inverter IV31, and the second inverter IV32. The first delay unit 300 may perform a delay operation.

In the second delay unit 400, since a high-level signal may be input to the first NAND gate ND41, the second delay unit 400 may delay the output of the first delay unit 300 by a signal processing time by, for example, the first NAND gate ND41, the first inverter IV41, and the second inverter IV42, and may output it to the third delay unit 500. Meanwhile, in the second delay unit 400, since a low-level signal may be input to the second NAND gate ND42, the second delay unit 400 may output a high-level signal to the signal output unit 700. The second delay unit 400 may perform a delay operation.

In the third delay unit 500, since a high-level signal may be input to the NAND gate ND51, the third delay unit 500 may delay the output of the second delay unit 400 by a signal processing time from the inner structures, for example, the NAND gate ND51, the first inverter IV51, and the second inverter IV52 and output it to the signal output unit 700. The third delay unit 500 may perform a delay operation.

The signal output unit 700 may receive and invert the output of the third delay unit 500 and output the output of the third delay unit 500 at an original phase. An even number of the logic elements ND31, IV31, IV32, ND41, IV41, IV42, ND51, IV51, IV52, and ND71 may be supplied with the input signal. Among them, since the NAND gates may function as the inverters, a phase of the output signal of the signal output unit 700 may be the same as that of the input signal.

As described above, the delay apparatus for a delay locked loop according to the embodiments may delay the input signal by a delay time that may vary according to a change in an operation voltage and output a delay locked loop clock whose phase has been corrected.

A delay apparatus for a delay locked loop according to another embodiment will be described.

The delay apparatus for a delay locked loop according to another embodiment may model in one structure signal processing structures through which a delay locked loop clock output by the delay locked loop may reach an output circuit of a semiconductor memory apparatus from an output terminal of the delay locked loop.

Figure 3:
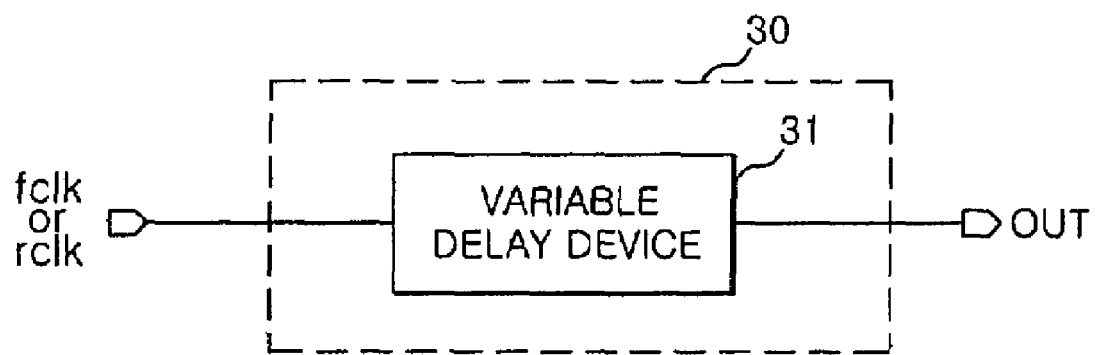
FIG. 3 is an exemplary block diagram illustrating a delay apparatus for a delay locked loop according to another embodiment.

As shown in FIG. 3, the delay apparatus for a delay locked loop may model a plurality of modeling delay devices in one variable delay device 31 in which a delay time may vary according to a change in an operation voltage.

The circuit structure of the variable delay device 31 may be the same as that shown in FIG. 2. However, since the variable delay device 31 may be formed by modeling the plurality of modeling delay devices in one modeling delay device, the delay time of the first to third delay units 300 to 500 may need to be designed to be longer than that in the embodiment of the present invention shown in FIG. 1, which can be achieved by changing sizes of inner elements or increasing the number of logic elements without departing from a predetermined logic.

It will be apparent to those skilled in the art that various modifications and changes may be made without departing from the scope and spirit of the invention. Therefore, it should be understood that the above embodiments are not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

The delay apparatus for a delay locked loop according to exemplary embodiments may delay and output the input signal by a delay time which may vary according to a change in an operation voltage. Therefore, a delay locked loop clock may be reliably output even through the operation voltage may be drastically changed. Further, since the delay locked loop clock may be reliably output, it may be possible to improve a function of a semiconductor memory apparatus that uses the delay locked loop clock.

What is claimed is:

1. A delay apparatus for a delay locked loop comprising:
a plurality of delay devices formed by modeling a plurality of signal processing structures adapted to receive a delay locked loop clock output from an output terminal of a delay locked loop and allow the delay locked loop clock output to pass through to an output circuit of a semiconductor memory apparatus,
wherein at least one of the plurality of delay devices comprises a variable delay device having a plurality of delay units adapted to vary a delay time according to whether a detection level of an operation voltage for operating the delay locked loop is lower or higher than a predetermined voltage level,
wherein the delay time varied according to a variation of a number of the delay units where the delay locked loop clock passed and wherein the operation voltage is an external voltage VDD.

2. The delay apparatus of claim 1,
wherein the variable delay device comprises:

a voltage detecting unit adapted to receive and detect the change in the operation voltage and to provide an output based thereon;
a delay time control unit adapted to receive the output of the voltage detecting unit and output a delay time control signal in response to the output of the voltage detecting unit;
the plurality of delay units adapted to receive the delay time control signal, selectively operate in accordance with the delay time control signal, delay an input signal for a delay time corresponding to the delay time control signal, and output the input signal; and
a signal output unit adapted to receive and combine the input signals output by delay units selected from the plurality of delay units into a combined signal and output the combined signal,
wherein a number of the delay units where the delay locked loop clock passed is varied according to the delay time control signal.

3. The delay apparatus of claim 2,
wherein the voltage detecting unit comprises:
a first voltage detecting section adapted to receive the operation voltage and detect when a voltage level of the operation voltage becomes a first voltage level which is lower than a voltage level of a normal voltage; and
a second voltage detecting section adapted to receive the operation voltage and detect when the voltage level of the operation voltage becomes a second voltage level which is higher than the voltage level of the normal voltage.

4. The delay apparatus of claim 2,
wherein the delay time control unit comprises:
a first control section adapted to receive the output of the voltage detecting unit and output a first delay time control signal associated with a decrease in delay time according to the output of the voltage detecting unit; and
a second control section adapted to receive the output of the voltage detecting unit and output a second delay time control signal associated with an increase in delay time according to the output of the voltage detecting unit.

5. The delay apparatus of claim 2,
wherein the plurality of delay units comprises:
a first delay unit adapted to receive the delay time control signal corresponding to the output of the voltage detecting unit which detects a decrease in the operation voltage and operate in accordance with the delay time control signal;
a second delay unit adapted to operate without receiving the delay time control signal; and
a third delay unit adapted to receive the delay time control signal corresponding to the output of the voltage detecting unit which detects an increase in the operation voltage and operate in accordance with the delay time control signal.

6. The delay apparatus of claim 2,
wherein the signal output unit comprises a logic element adapted to receive a second delay time control signal output of a delay unit selected from among the plurality of delay units.

7. A delay apparatus for a delay locked loop adapted to model at least one signal processing structure adapted to receive a delay locked loop clock output by a delay locked loop and to allow the delay locked loop clock to pass through to an output circuit of a semiconductor memory apparatus from an output terminal of the delay locked loop, the delay apparatus comprising:

a voltage detecting unit adapted to detect whether a level of an operation voltage for operating the delay locked loop is lower or higher than a predetermined voltage level and to provide an output based thereon;

a delay time control unit adapted to receive the output of the voltage detecting unit and output a delay time control signal in response to the output of the voltage detecting unit;

a plurality of delay units adapted to receive the delay time control signal, selectively operate in accordance with the delay time control signal, delay the delay locked loop clock for a delay time corresponding to the delay time control signal by varying a number of the delay units where the delay locked loop clock passed, and output the delay locked loop clock; and a signal output unit adapted to receive and combine the delay locked loop clocks output by delay units selected from among the plurality of delay units and output the combination as the delay locked loop clock, wherein a number of the delay units where the delay locked loop clock passed is varied according to the delay time control signal and the operation voltage is an external voltage VDD.

8. The delay apparatus of claim 7,
wherein the voltage detecting unit comprises:
a first voltage detecting section adapted to receive the operation voltage and detect when a voltage level of the operation voltage becomes a first voltage level which is lower than the voltage level of a normal voltage; and
a second voltage detecting section adapted to receive the operation voltage and detect when the voltage level of the operation voltage becomes a second voltage level which is higher than the voltage level of the normal voltage.

9. The delay apparatus of claim 7,
wherein the delay time control unit comprises:
a first control section adapted to receive the output of the voltage detecting unit and output a first delay time control signal associated with a decrease in delay time according to the output of the voltage detecting unit; and
a second control section adapted to receive the output of the voltage detecting unit and output a second delay time control signal associated with an increase in delay time according to the output of the voltage detecting unit.

10. The delay apparatus of claim 9,
wherein the first control section comprises:
a signal input unit adapted to receive the output of the voltage detecting unit and input the first delay time control signal according to the output of the voltage detecting unit to a delay unit among the plurality of delay units associated with the decrease in delay time;
an inverting element adapted to receive the output of the voltage detecting unit and to provide an output based thereon; and
a logic element adapted to receive the output of the inverting element and provides the input signal and the first delay time control signal according to the output of the inverting element to a delay unit among the plurality of delay units.

11. The delay apparatus of claim 10,
wherein the signal input unit comprises a signal line.

12. The delay apparatus of claim 9,
wherein the second control section comprises:
a signal input unit adapted to receive the output of the voltage detecting unit and input the second delay time control signal according to the output of the voltage detecting unit to a delay unit among the plurality of delay units associated with the increase in delay time; and
an inverting element adapted to receive the output of the voltage detecting unit and input the second delay time control signal according to the output of the voltage detecting unit to a delay unit among the plurality of delay units.

13. The delay apparatus of claim 12,
wherein the signal input unit comprises a signal line.

14. The delay apparatus of claim 7,
wherein the plurality of delay units comprises:
a first delay unit adapted to receive the output of the delay time control signal corresponding to the output of the voltage detecting unit which detects a decrease in the operation voltage and operate in accordance with the delay time control signal to provide an output;
a second delay unit adapted to operate without receiving the delay time control signal to provide an output; and
a third delay unit adapted to receive the delay time control signal corresponding to the output of the voltage detecting unit which detects an increase in the operation voltage and operate in accordance with the delay time control.

15. The delay apparatus of claim 14,
wherein the first delay unit comprises:
a logic element adapted to receive the input signal and the delay time control signal corresponding to the output of the voltage detecting unit which detects the decrease in the operation voltage and to provide an output based thereon; and
a plurality of inverting elements coupled in series and adapted to receive the output of the logic element as input.

16. The delay apparatus of claim 14,
wherein the second delay unit comprises:
a first logic element adapted to receive the output of the first delay unit and the delay time control signal corresponding to the output of the voltage detecting unit which detects the decrease in the operation voltage and to provide an output based thereon;
a plurality of inverting elements connected in series and adapted to receive the output of the first logic element and to provide an output based thereon; and
a second logic element adapted to receive the output of the plurality of inverting elements and the delay time control signal corresponding to the output of the voltage detecting unit which detects the increase of the operation voltage as input.

17. The delay apparatus of claim 14,
wherein the third delay unit comprises:
a logic element adapted to receive the output of the second delay unit and the delay time control signal corresponding to the output of the voltage detecting unit which detects the increase in the operation voltage and output an output of the logic element; and
a plurality of inverting elements coupled in series and adapted to receive the output of the logic element.

18. The delay apparatus of claim 7,
wherein the signal output unit comprises a logic element adapted to receive the output of a delay unit selected from among the plurality of delay units.

* * * * *